United States Patent [19]
Bhatt

[11] 3,878,442
[45] Apr. 15, 1975

[54] ELECTRICAL CONDUCTOR HAVING A HIGH RESISTANCE TO ELECTROMIGRATION

[76] Inventor: Harshad J. Bhatt, Wappingers Falls, N.Y.

[22] Filed: Oct. 1, 1971

[21] Appl. No.: 185,672

Related U.S. Application Data

[62] Division of Ser. No. 40,635, May 26, 1970, Pat. No. 3,647,119.

[52] U.S. Cl. .............................. 357/67; 29/624
[51] Int. Cl. .............................. H01l 5/00
[58] Field of Search ............... 317/234, 5.2; 75/138; 29/624

[56] References Cited

UNITED STATES PATENTS 3,073,294 1/1963 Brown et al. ...................... 123/188
3,297,415 1/1967 Allen ................................ 29/191.6
3,474,530 10/1969 Ainslie et al. ........................ 29/624

*Primary Examiner*—John W. Huckert
*Assistant Examiner*—E. Wajciechowicz
*Attorney, Agent, or Firm*—Harry M. Weiss

[57] ABSTRACT

This disclosure is directed to an improved semiconductor device, electrical conductor, thin film conductor, and fabrication methods therefor. An aluminum-aluminum oxide alloy conductor is disclosed which has a high resistance to electromigration and hence, a conductor lifetime greater by at least a factor of 10 than unalloyed aluminum conductors. Semiconductor devices utilizing this aluminum alloy in the thin film conductive stripes interconnecting different conductivity regions or devices located in the semiconductor substrate are significantly improved and more reliable.

7 Claims, 3 Drawing Figures

FIG. I
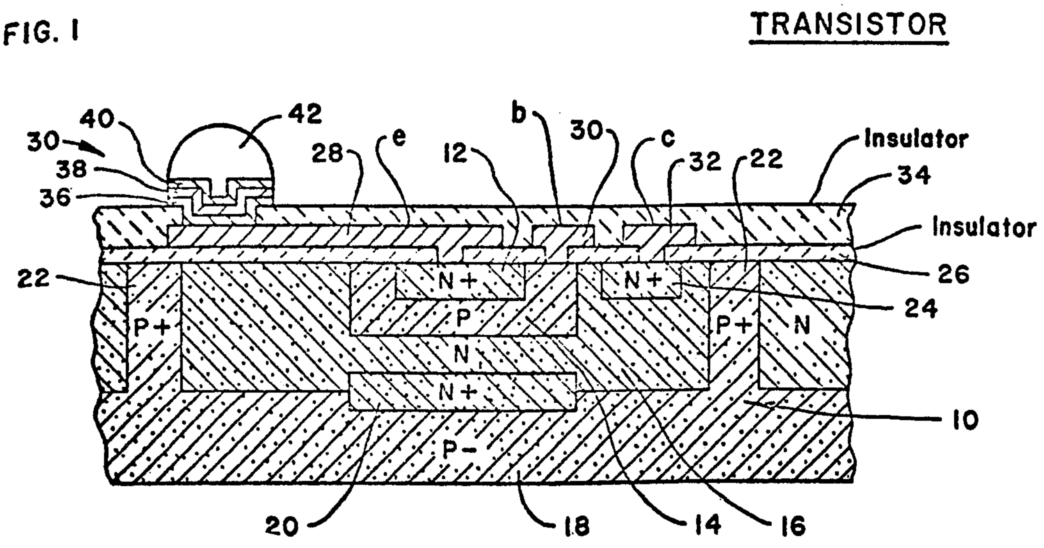
FIG. 2
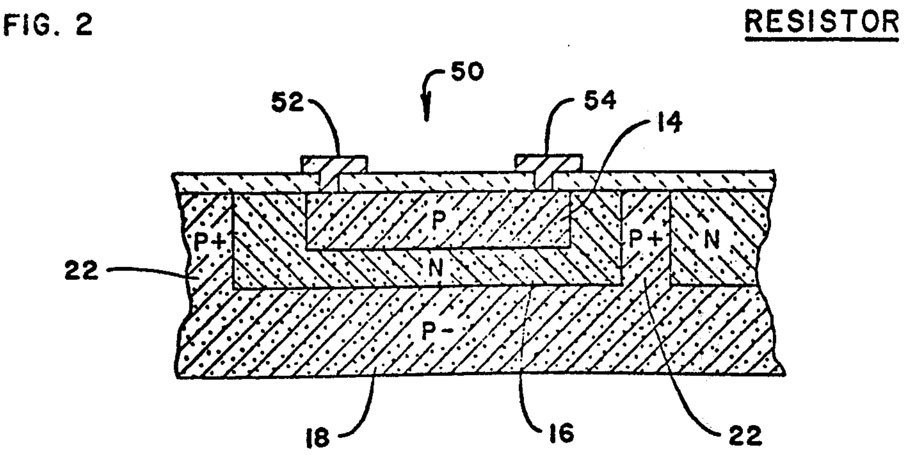
FIG. 3
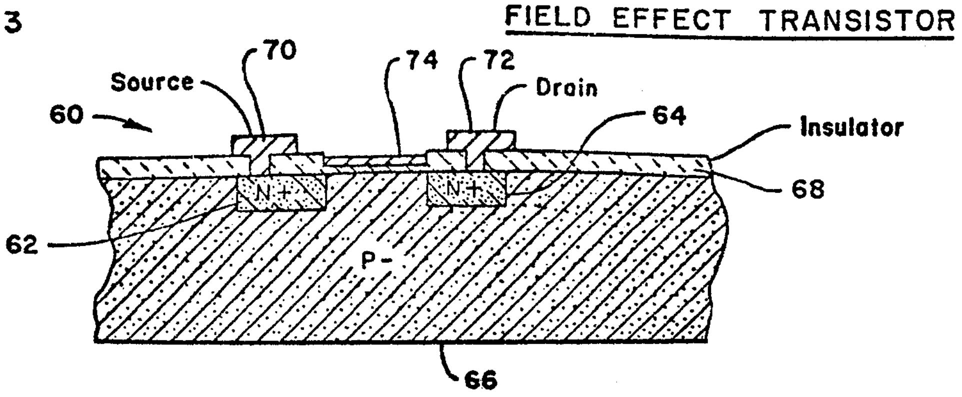

ELECTRICAL CONDUCTOR HAVING A HIGH RESISTANCE TO ELECTROMIGRATION

This is a division of U.S. Pat. application Ser. No. 40,635, filed May 26, 1970, now U.S. Pat. No. 3,647,119.

BACKGROUND OF THE INVENTION

1. Field of the Invention

The invention relates generally to semiconductor devices, electrical conductors, thin film conductive stripes and fabrication methods therefor, and more particularly, relates to semiconductor devices having aluminum alloy thin film conductive stripes for interconnecting regions or devices in a monolithic integrated semiconductor structure.

2. Description of the Prior Art

In the past, semiconductor devices made of silicon were fabricated using aluminum as the single metallurgy for interconnecting semiconductor regions or devices located in a single substrate. The technique used was to deposit, such as by evaporation, an aluminum thin film layer on an oxidized silicon substrate containing a plurality of regions of opposite type conductivity so as to permit interconnection of semiconductor devices defined by these regions of opposite type conductivity into a desired circuit. The use of aluminum as the thin film conductive stripe or interconnection is considered highly desirable by silicon semiconductor device manufacturers because of the ability of aluminum to provide a good ohmic contact to N or P-type regions located in the silicon semiconductor substrate.

However, a serious reliability and lifetime problem was discovered using aluminum as the thin film conducting stripe material for silicon devices. Under certain conditions of temperature, current, and aluminum stripe geometry, the aluminum of the thin film conductor or stripe, migrated and, in a relatively short period of time, caused the formation of opens or voids in the thin film conductive stripe which resulted in the failure of both the devices and the electrical circuit defined by the devices. This problem became known as the aluminum electromigration problem and has baffled and caused a great deal of concern to the silicon semiconductor device manufacturers. Some manufacturers, in an attempt to completely avoid the aluminum electromigration problem, decided to use other metallurgies than aluminum. However, the use of aluminum with its low cost, good conductivity, excellent ohmic contact features and known deposition process characteristics made it highly desirable for semiconductor device interconnection.

U.S. Pat. No. 3,474,530 is directed to the electromigration subject and provides background and prior art solutions for the aluminum electromigration problem. In this patent, one solution to increase the lifetime and reliability of a semiconductor device by means of improving the electromigration resistance of the stripe or conductor was to vary the geometry of the stripe. However, the increase in device or stripe lifetime that is achieved by changing stripe geometry is relatively insignificant and is only a minor solution to the aluminum electromigration problem. This prior art patent also infers that dopants may possibly improve aluminum electromigration; however, no specific dopants are suggested and no teaching is provided for improving the electromigration problem with any particular dopant.

In the IBM Technical Disclosure Bulletin, p. 1,544, Vol. 12, No. 10, March 1970, there is a reference to growing single crystal whiskers wherein it is mentioned that an alloy of aluminum and copper provides better resistance to electromigration than regular aluminum. Although the use of an aluminum-copper alloy in a thin film stripe may provide a higher resistance to electromigration than using aluminum alone, there are a number of very serious technical disadvantages associated with this particular alloy. Firstly, Al-Cu as an alloy is highly corrosive. Secondly, copper is known to be a poison to semiconductor device junctions and hence, any diffusion of copper from the Al-Cu alloy into the silicon substrate can cause device failure. Thirdly, the aluminim-copper alloy is considered to be poor from a stress corrosion cracking standpoint. Fourthly, since Cu is soluble in the solid solution of the Al-Cu alloy, copper will percipitate out of the solid solution under certain chemical concentration and temperature cycling conditions thereby leaving regions of the conductive stripe devoid of copper necessary to resist electromigration which results in stripe failure in these regions because of electromigration. Fifthly, Al-Cu has an even lower melting point than pure aluminum whose melting point is about 660° C and hence, annealing operations after alloy deposition have to be carefully controlled and restricted in both time and temperature. Furthermore, in the fabrication of very high speed devices, it is necessary to use shallow diffused regions which may not be compatible with this alloy because of the greater penetration into silicon considered to be associated with metals that have relatively low melting points. This penetration will short out shallow diffused regions. Sixthly, the Al-Cu alloy may not provide a thin film conductive stripe that has a high resistance to physical distortions and surface discontinuities known in the art as hillocks, depressions, pyramids, and whiskers which usually result in electrical shorting, especially in multilayered conductor-insulator structures.

Accordingly, a need existed for fabricating and providing a thin film aluminum based stripe which would not have the above problems associated with Al-Cu and would be highly resistant to electromigration thereby significantly extending the lifetime of semiconductor devices using the improved thin film aluminum based stripe material.

Accordingly, it is an object of this invention to provide improved semiconductor devices.

It is another object of this invention to provide an improved electrical conductor.

It is still another object of this invention to provide an improved thin film conductive stripe.

It is a still further object of this invention to provide a method for fabricating a semiconductor device with a stripe which is highly resistant to electromigration.

It is another object of this invention to provide a method for fabricating a thin film conductive stripe which has a high electromigration resistance In accordance with one embodiment of this invention, an electrical conductor is provided which comprises an aluminum alloy having a high resistance to electromigration. The aluminum alloy is composed of aluminum and aluminum oxide. The aluminum oxide is in the range of from about 0.01 percent to about 17 percent of the aluminum alloy. Preferably, the aluminum oxide is in the range of from about 0.5 percent to about 14 percent of the aluminum alloy and optimumly, the aluminum oxide is in the range of from about 6 to about 8 percent of the aluminum alloy.

In accordance with a further embodiment of this invention, a thin film conductive stripe is provided with an aluminum-aluminum oxide alloy, as defined above, having a high resistance to electromigration.

In accordance with a still further embodiment of this invention, a semiconductor device is provided which comprises a semiconductor body having at least one region of one type conductivity. A thin film conductive stripe is in electrical contact to the one region of the semiconductor body. The stripe is composed of the aluminum-aluminum oxide alloy, as described above.

In accordance with other embodiments of this invention, electrical conductors, thin film conductors, and semiconductor devices are provided wherein the use is made of an aluminum alloy having a high resistance to electromigration. The aluminum alloy has an activation energy of at least 0.8 electron volts. Preferably, the aluminum alloy has an activation energy in the range of from 0.8 to about 14 electron volts and, optimumly, has an activation energy range of from 0.8 to about 3 electron volts with the ideal activation energy of 1 electron volt. The importance of a high activation energy is discussed in the above cited prior art patent.

In accordance with still other embodiments of this invention, electrical conductors, thin film conductors, and semiconductor devices are provided wherein the use is made of an aluminum alloy having a high resistance to electromigration which alloy utilizes a mixture of aluminum and insoluble impurities.

Other embodiments of this invention are directed to the fabrication process for making the thin film aluminum-aluminum oxide conductive stripe and semiconductor devices using the thin film aluminum-aluminum oxide conductive stripe.

The foregoing, and other objects, features and advantages of the invention will be apparent from the following, more particular description of the preferred embodiments of the invention, as illustrated in the accompanying drawings.

DESCRIPTION OF DRAWINGS

FIG. 1 is a side elevational view, in section, of a transistor device located within a monolithic integrated circuit having the aluminum conductive stripe of this invention.

FIG. 2 is a side elevational view, in section, of a resistor device located within a monolithic integrated semiconductor structure having the aluminum alloy conductive stripe of this invention.

FIG. 3 is a side elevational view, in section, of a field effect transistor (FET) device having the aluminum alloy conductive stripe in accordance with this invention.

FABRICATION METHOD

A number of alternative methods can be used to fabricate the semiconductor device, electrical conductor, or the thin film alloy stripe of this invention.

In one method, an evaporation technique was used wherein desired aluminum-aluminum oxide alloy was evaporated onto an oxidized surface located on a silicon semiconductor substrate. The manner in which this was achieved was to process the semiconductor substrate or body through a number of conventional process steps including epitaxy, diffusion, oxidation, photolithographic masking and etching operations prior to deposition of the aluminum-aluminum oxide alloy. The aluminum-aluminum oxide alloy was evaporated onto the oxidized semiconductor substrate to form a conductive stripe thereon and to make electrical contact to regions of different conductivity type located in the semiconductor substrate. In the evaporation process by standard resistance heating techniques, a tungsten moat containing pieces of high purity aluminum was heated up to evaporate off the aluminum. The bell jar or container in which the evaporation process was carried out was maintained at a pressure of $4 \times 10^{-6}$ Torr. Air (as an oxygen source) was leaked into the system at a pressure of $8 \times 10^{-5}$ Torr thereby providing a constant gage reading for the bell jar system of $8 \times 10^{-5}$ Torr during metal deposition. In this example, the substrate temperature was 105° C and the thickness of the film deposited was 12,500 A. Accordingly, the air leaked into the evaporation system permitted an aluminum-aluminum oxide alloy film to be deposited onto the oxidized semiconductor substrate.

Another evaporation method for depositing the aluminum-aluminum oxide alloy is to use aluminum particles or powders coated with aluminum oxide which are available as standard commercial products from Reynolds Aluminum Co. and Metal Disintegrating Co. These particles or powders are placed into an evaporation moat for deposition, by resistance heating techniques, onto the suitably oxidized semiconductor substrate. This is a direct evaporation process using good vacuum conditions. The aluminum-aluminum oxide SAP (Sintered Aluminum Powders) type material fit into the category of dispersion-strengthened alloys with the feature of having high mechanical strength at temperatures approaching the melting point of aluminum, which is about 660° C.

Alternatively, a disc-shaped target or a bar-shaped configuration of the aluminum-aluminum oxide alloy can be fabricated in the following manner: cold power compaction of the above described SAP-type materials, vacuum sintering, hot pressure or compression, followed by a hot extruding step. In order to form the desired disc or bar shape, hot rolling is performed to transform the extruded rod to any desired thickness and shape for use in either evaporation or sputtering operations.

Another evaporation technique for depositing the aluminum-aluminum oxide alloy onto an oxidized semiconductor substrate is to co-evaporate aluminum and alumina (aluminum-oxide) from two separate crucibles or evaporation cups onto the oxidized substrate surface.

Another form of deposition is to sputter the alloy rather than to evaporate it. In sputtering the alloy directly onto an oxidized semiconductor substrate, either DC or RF sputtering techniques are utilized. Recently the trend has been to use RF sputtering techniques even in depositing metal films (besides dielectric films) onto a substrate because of the great degree of deposition control and uniformity of deposited film that is achieved by the RF sputtering process. Accordingly, a target electrode having a thickness of about 20 to 30 mils and a diameter of about 5 inches was fabricated in a disc form from an aluminum-aluminum oxide alloy bar by the process techniques described above. This target electrode was placed into an RF sputtering apparatus and used as the cathode. During the RF sputtering operation, argon atoms were introduced into the RF sputtering apparatus and ionized. The ionized argon atoms were accelerated to strike the aluminum-aluminum oxide target cathode thereby causing the aluminum-aluminum oxide particles to be sputtered off the target electrode onto the anode which contained a number of semiconductor substrates. In this manner, the RF sputtered alloy film was deposited onto the semiconductor substrate to the desired thickness which is controlled by the usual time and deposition rate conditions.

The aluminum-aluminum oxide alloy thin film has very significant advantages over aluminum films. The aluminum-aluminum oxide alloy has a very significant improvement in electromigration as shown in the table below in comparison to a substantially pure aluminum film.

ELECTROMIGRATION TEST RESULTS

A. PURE ALUMINUM

Film Thickness = 15,000 A
Current Density = 1 × 10⁶ amps/cm²
Conductive Stripe Geometry = 140 mil long × 0.4 mil wide
Furnace Temperature = 150° C

| Stripe Specimen Number | Time to Failure*hrs. | Average Time to Failure, hrs. | Average Time to Failure of all Specimens, hrs. |
|---|---|---|---|
| 1 | >17 <29 | 23 | |
| 2 | >17 <29 | 23 | 35 |
| 3 | >29 <43 | 36 | |
| 4 | >50 <64 | 57 | |

*the stripe showed failure by an open circuit

B. ALUMINUM + OXYGEN (AIR)

Stripe formed by aluminum evaporation with controlled air leak
Film Thickness = 12,500 A
Current Density, conductive stripe geometry, furnace temperature — Same as A

RUN 1

| Stripe Specimen Number | Time to Failure*hrs. | Average Time to Failure, hrs. | Average Time to Failure of All Specimens, hrs. |
|---|---|---|---|
| 1 | >217 <232 | 225 | |
| 2 | >450 <460 | 455 | |
| 3 | >552 <569 | 560 | 590 |
| 4 | >617 <620 | 618 | |
| 5 | >666 <672 | 669 | |
| 6 | >696 <711 | 703 | |
| 7 | >720 <734 | 727 | |
| 8 | >744 <783 | 763 | |

RUN 2

| Stripe Specimen Number | Time to Failure*hrs. | Average Time to Failure, hrs. | Average Time to Failure of All Specimens, hrs. |
|---|---|---|---|
| 1 | >97 <112 | 104 | |

RUN 2-Continued

| Stripe Specimen Number | Time to Failure*hrs. | Average Time to Failure, hrs. | Average Time to Failure of All Specimens, hrs. |
|---|---|---|---|
| 2 | >161 <170 | 165 | |
| 3 | >257 <265 | 261 | |
| 4 | >286 <307 | 296 | |
| 5 | >425 <429 | 427 | |
| 6 | >509 <521 | 515 | |
| 7 | NF552 | — | |
| 8 | NF552 | — | |
| 9 | NF552 | — | |

NF—no failure

RUN 3

Current Density=1.5×10⁶ amps/cm²
Film Thickness same for B, Conductive Stripe Geometry and Furnace Temperature same as in A

| | | | |
|---|---|---|---|
| 1 | >30 <43 | 36 | |
| 2 | >46 <50 | 48 | 178 |
| 3 | >240 <281 | 260 | |
| 4 | >362 <379 | 370 | |

RUN 4 (Same stripe current density, parameters and conditions as in Run 3)

| | | | |
|---|---|---|---|
| 1 | >76 <88 | 82 | |
| 2 | >94 <97 | 95 | |
| 3 | >97 <112 | 1104 | |
| 4 | >118 <161 | 139 | |
| 5 | >193 <209 | 201 | |
| 6 | >193 <209 | 201 | |
| 7 | >209 <212 | 210 | |
| 8 | >209 <212 | 210 | |
| 9 | >221 <233 | 227 | |
| 10 | >257 <265 | 261 | |
| 11 | >286 <331 | 308 | |
| 12 | >286 <331 | 308 | |
| 13 | >286 <331 | 308 | 212 |
| 14 | >286 <331 | 308 | |

As can be seen by comparing the results of A (pure aluminum) with B (aluminum-aluminum oxide), very significant increases in device and conductive stripe lifetimes are achieved using the aluminum-aluminum oxide thin film conductive stripe of this invention. These significant increases shown in B are even more startling when it is recognized that the films of B (12,500 A) are thinner than the films in A (15,000 A). From the above cited prior art patent, thicker films provide longer lifetimes. The conditions of current and temperature used in A and B are not the usual operating conditions; however, in order to obtain expected lifetime data, accelerated conditions using higher currents and temperatures provide an accurate indication of time to failure for the semiconductor device or integrated circuit composed of a number of semiconductor devices.

Runs 3 and 4 of B were conducted at current levels that are 1.5 times the current levels used in A. Accordingly, since stripe and device lifetime are directly related to the amount of current surging through the stripe, the fact that the average lifetime of the devices and stripes shown in Runs 3 and 4 of B are still substantially greater than the average lifetime of the aluminum stripes in A is very significant in view of the current levels in Runs 3 and 4 of B being 50 percent greater than the current levels in A.

Furthermore, the device or stripe specimens identified in A were subjected to an annealing operation subsequent to aluminum deposition. This annealing operation improves device and stripe resistance to electromigration thereby providing a longer lifetime device or stripe. The device or stripe specimens identified in B were not subjected to an annealing operation which would have increased the lifetime of the devices or stripes in B.

Furthermore, in comparison to the aluminum-copper alloy referred to above in the IBM TDB publication that is mentioned as having better electromigration properties than aluminum, the aluminum-aluminum oxide alloy is not corrosive, can be heated to significantly higher temperatures without destroying the film, will not penetrate into the silicon substrate as easily as Al-Cu, does not have stress corrosion cracking weakness, cannot contaminate or poison the semiconductor junctions as is possible with copper diffusing into silicon from the aluminum-copper alloy, is more stable as an alloy than Al-Cu because aluminum oxide is an insoluble precipitate and will not precipitate out into the solid solution during temperature cycling whereas copper is soluble in aluminum and hence, percipitates out from the Al-Cu solid solution causing an unstable film to be formed.

The aluminum-aluminum oxide alloy can be heat treated to higher temperatures than aluminum or Al-Cu without deterioration of the film. This is extremely critical in certain steps in the fabrication of semiconductor devices where heat treatment or annealing or sintering operations are desired. For example, in the fabrication of an FET device, it may be necessary to perform an annealing step subsequent to device formation so as to better control the surface characteristics of the channel region located between the source and drain regions of the device. In this operation, a heat treatment step is preferably carried out above 500° C so to permit the formation of a stable channel region between the source and drain portions of the FET device. Since aluminum alone and aluminum-copper alloys begin to deteriorate, degrade or melt between 550°–660° C (with aluminum-copper having a lower melting temperature than aluminum) the use of either aluminum or aluminum copper is undesirable where heat treatements are to be carried out at close to melting point (Al) temperatures and/or for sustained periods of time for annealing purposes.

In one example, an aluminum-aluminum oxide conductive film that was RF sputtered onto a semiconductor substrate was heat treated to a temperature of 600° C for a period of ½ hour without any degradation or destruction of the film. In comparison, an evaporated film of pure aluminum deposited on a semiconductor substrate, was heat treated at 600° C for the same period of time (in the same furnace) and this film was substantially altered due to heating. The ability of the aluminum-aluminum oxide conductive film to be heat treated and to remain stable at close to the aluminum melting point temperature is very significant to high speed semiconductor device manufacturers since it would permit these stripes or films to have normally lower penetration into the silicon substrate during any annealing or heat treatment steps in the semiconductor fabrication process. As a result, since the direction of the semiconductor industry is to use shallower diffusions that are necessary for very high speed devices to be fabricated, the importance of a thin film alloy which will not penetrate deeply into a shallow diffused semiconductor region and thereby short through the shallow region into another region of opposite type conductivity located behind the shallow region is self-evident.

DESCRIPTION OF THE DRAWING

Referring to FIG. 1, reference numeral 10 refers generally to a transistor device located within an integrated semiconductor structure. The transistor device 10 contains an emitter region 12, a base region 14, and a collector region 16. While the embodiment shown in FIG. 1 is that of an NPN transistor device wherein the emitter and collector regions are of N-type conductivity, and the base region is of P-type conductivity, it is obvious that a PNP transistor device can also be used in accordance with the teachings of this invention.

In the fabrication of the NPN transistor device shown in FIG. 1, a starting substrate 18 of P- type conductivity is used to start the semiconductor process. The P- type substrate is fabricated by the usual crystal growing (using Boron doping) and crystal rod slicing techniques. The N-type (or collector) region 16 is deposited on the P- type substrate 18 by epitaxial techniques. However, the N-type region 16 is deposited after the formation of N+ subcollector region 20 which is performed by, for example, an arsenic diffusion operation through a photolithographically masked and etched out opening in an oxide or insulating film located on the P— type substrate 18.

Subsequent to the N-type epitaxial deposition step, a P+ diffusion operation (using Boron impurities) is carried out (after appropriate photolithographic masking and etching operations) to form the surrounding isolation region 22 which isolates individual pockets of N-type regions 16. This individual N-type pocket region subsequently is used as the collector region 16 of the transistor device 10. After the isolation operation, the base region 14 is formed by diffusion (using Boron impurities) into the N-type region 16 using conventional photolithographic masking and etching techniques to form an opening in the oxide region above where the diffusion is to take place. In the same manner, the N+ emitter region 12 is formed (using Phosphorous impurities) within the base region 14 and, at the same time, N+ region 24 is formed within collector region 16 so as to provide an improved electrical contact region for the collector region 16. Insulator layer 26 shown in contact with the semiconductor surface is preferably of thermally or otherwise deposited silicon dioxide but also can be comprised of the following insulators or combinations thereof: silicon nitride, aluminum oxide, etc.

A conductive thin film stripe 28 composed of aluminum and aluminum oxide (deposited according to any of the processes described above) carries current to the emitter region 12 from a terminal generally noted by reference numeral 30. The stripe 28 makes electrical contact to the emitter region 12 from a terminal generally noted by reference numeral 30. The stripe 28 makes electrical contact to the emitter region 12 through an opening located in the insulator layer 26. Similarly, the same alloy material provides electrical ohmic contacts to the base region 14 and to the N+ collector region 24 by means of the aluminum-aluminum oxide stripes 30 and 32, respectively. A second insulator layer 34 serves as an encapsulant to cover and protect the surface of the semiconductor device including the metal conductors located thereon. Preferably the insulator layer 34 is an RF sputtered quartz layer that is deposited onto the surface of the structure shown in FIG. 1.

The terminal contact 30 is fabricated by etching, using photolithographic etching and masking techniques, an opening in the insulator film 34 over the portion of the conductive stripe 28 where contact is to be made. Obviously, the terminal contact can be made to the base or collector stripe, if desired. If needed, RF sputter etching techniques can also be used to open up or clean out the hole in the insulator layer 34. After the terminal opening is formed, successive evaporations are carried out with chrome, copper and gold using suitable masks, preferably of apertured molybdenum. Hence, chrome layer 36, copper layer 38, and gold layer 40 in the manner shown in FIG. 1 is deposited into the opening in the insulating layer 34. Following the chrome, copper and gold deposition process, which is carried out by vacuum evaporation techniques, a lead/tin pad 42 is deposited onto the region of the structure shown in FIG. 1 located over the chrome, copper, gold deposited layers. The lead/tin pad 42 is preferably composed of 95 percent lead, 5 percent tin and is deposited onto the desired region by means of evaporation techniques using a suitable apertured molybdenum mask.

Accordingly, the transistor device 10 with its aluminum-aluminum-oxide alloy stripes 28, 30 and 32 is capable of having a much greater lifetime and hence is significantly more reliable than transistor devices made with conventional aluminum stripes.

Referring to FIG. 2, a passive device is shown which is formed within a monolithic integrated structure. The passive device of FIG. 2 is a resistor generally designated by reference numeral 50. Similar reference numerals are used in FIG. 2 to denote similar regions so as to indicate that the resistor device of FIG. 2 is preferably formed in a monolithic structure along with the active or transistor device of FIG. 1. In this embodiment the N-type region 16 serves as an isolation region for the P-type region 14 which now serves as the semiconductor resistor region of the resistor device 50. The region 14 and the regions 16, 22 and 18 are formed in the same manner as described above with regard to the transistor device 10. Accordingly, the P-type region 14 is formed during the base diffusion operation. Contacts 52 and 54 at spaced portions of the P-type region 14 provide electrical contact to the semiconductor P-type region 14 thereby providing an electrical resistance using the P-type region 14 as a resistor. As indicated above with reference to FIG. 1, if desired, an N-type resistor region can be utilized instead of a P-type region either by selecting opposite dopants to form opposite regions of conductivity or by making electrical contact to the N-type region 16 for that type of resistor if desired. Similarly, while a passive device is shown in FIG. 2 as being a resistor device, it is evident that semiconductor capacitors or inductors can also be used. The stripe contacts 52 and 54 are made of the aluminum-aluminum oxide alloy of this invention which greatly increases the lifetime of the resistor device 50.

Referring to FIG. 3 a field effect transistor device is shown as generally designated by reference numeral 60. The field effect transistor device 60 is shown as a normally off N-channel device. It should be evident that a P-channel device (having P-type source and drain regions) can also be used in accordance with this invention. The N-channel field transistor device 60 is comprised of two N+ regions 62 and 64 located within a P− type substrate 66. Using conventional diffusion techniques, the N+ regions 62 and 64 are formed in a single diffusion step onto spaced surface regions of the P− type substrate 66. An insulator film 68 is located on a surface of the P type region 66. The insulator layer 68 is preferably composed of silicon dioxide or combinations of silicon dioxide, aluminum oxide or silicon nitride. Contacts or stripes 70 and 72 are respectively provided to N+ regions 62 and 64 so as to provide electrical contact thereto. Contact 70 serves as a source contact and contact 72 serves as a drain contact. A thin metal stripe or layer 74 serves as a gate electrode so as to create, upon the application of a voltage thereto, the channel between the N+ regions 62 and 64 of the FET device. The source contact 70, the drain contact 72 and gate electrode 74 are composed of the aluminum-aluminum oxide alloy of this invention and thus provide the FET device 60 with a much greater lifetime and reliability. While the FET device 60 is shown in FIG. 3 to be a MOS (Metal Oxide Silicon) type device, it is obvious that the practice of this invention can be performed with FET devices that do not use a gate oxide.

The thin film conductive stripe or electrical contacts shown in FIGS. 1, 2 or 3 can have a stripe width in the range of from about 0.1 mils to about 2 mils. For most preferred device applications, the stripe width is in the range of from about 0.2 to 0.4 mils. The stripe thickness (on the insulating layer) is in the range of from about several hundred Angstoms to about 20,000 Angstoms. Preferably, the stripe thickness is in the range of from about 5,000 Angstroms to about 15,000 Angstroms. Because of the improved electromigration properties of the aluminum-aluminum oxide thin film conductive stripe, narrower and thinner stripes can be formed for semiconductor device use. This permits greater device density because of the use of reduced stripe dimensions thereby permitting signficant improvement in circuit density in a monolithic integrated semiconductor substrate or chip. Furthermore, for multilevel integrated circuit structures where use is made of alternate layers of metal and insulator, the thin film conductive stripe alloy of this invention permits very significant advantages and performance improvement.

While transistors and FET devices are shown in FIGS. 1 and 3, it is readily apparent to those skilled in the art that other active devices such as diodes, PNPN and NPNP, etc. devices can be fabricated in accor ance with the techniques of this invention and are included within the scope of the attached claims. Additionally, while aluminum oxide is one type of insoluble impurity in aluminum solid solution that provides improvements in electromigration, other impurities insoluble in aluminum solid solutions which provide increased stripe and device lifetime can also be used and hence, the claims of this invention are intended to cover these other impurities. Still further, while aluminum oxide dramatically increases the activation energy of the aluminum alloy to levels of at least 0.8 electron volts, the claims of this invention are intended to cover the use of other impurities which would also cause both increase in the activation energy of the alloy as well as increase the stripe and device lifetime.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. An electrical conductor comprising an aluminum alloy having a high resistance to electromigration, said aluminum alloy being composed of aluminum and aluminum oxide, said aluminum oxide is in the range from about 0.01 percent to about 5 percent of said aluminum alloy.

2. An electron current carrying thin film conductive stripe comprising an aluminum alloy layer having a high resistance to electromigration, said aluminum alloy layer being composed of aluminum and aluminum oxide, said aluminum oxide is in the range of from about 0.01 percent to about 17 percent of said aluminum alloy, said stripe having a thickness in the range of from about several hundred Angstroms to about 20,000 Angstroms.

3. A thin film conductive stripe in accordance with claim 2 wherein said aluminum oxide is in the range of from about 0.5 percent to about 14 percent of said aluminum alloy.

4. A thin film conductive stripe in accordance with claim 3 wherein said aluminum oxide is in the range from about 6 to about 8 percent of said aluminum alloy.

5. A thin film conductive stripe in accordance with claim 2 wherein said stripe having a width in the range of from about 0.1 mils to about 2 mils.

6. A thin film conductive stripe in accordance with claim 5 wherein said stripe having a width in the range of from about 0.2 mils to about 0.4 mils.

7. A thin film conductive stripe in accordance with claim 2 wherein said stripe having a thickness in the range of from about 5,000 Angstroms to about 15,000 Angstroms.

* * * * *